US 6,740,534 B1

(12) United States Patent
Adams, III et al.

(10) Patent No.: US 6,740,534 B1
(45) Date of Patent: May 25, 2004

(54) DETERMINATION OF A PROCESS FLOW BASED UPON FAULT DETECTION ANALYSIS

(75) Inventors: Ernest D. Adams, III, Austin, TX (US); Matthew A. Purdy, Austin, TX (US); Gregory A. Cherry, Austin, TX (US); Eric O. Green, Austin, TX (US); Elfido Coss, Jr., Austin, TX (US); Brian K. Cusson, Austin, TX (US); Naomi M. Jenkins, Round Rock, TX (US); Patrick M. Cowan, Pflugerville, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 12 days.

(21) Appl. No.: 10/246,341

(22) Filed: Sep. 18, 2002

(51) Int. Cl.⁷ ............................................... G01R 31/26
(52) U.S. Cl. ........................................................ 438/14
(58) Field of Search ...................... 438/14; 324/158.1; 700/180

(56) References Cited

U.S. PATENT DOCUMENTS 6,303,395 B1 * 10/2001 Nulman ...................... 438/14
6,563,300 B1 * 5/2003 Jackson ................... 324/158.1

* cited by examiner

*Primary Examiner*—John F. Niebling
*Assistant Examiner*—Andre' C. Stevenson
(74) *Attorney, Agent, or Firm*—Williams, Morgan & Amerson, P.C.

(57) ABSTRACT

A method and an apparatus for the determination of a process flow based upon fault detection. A process step upon a workpiece is performed. Fault detection analysis based upon the process step performed upon the workpiece is performed. A workpiece routing process is performed based upon the fault detection analysis. The wafer routing process includes using a controller to perform one or a rework process routing, a non-standard process routing, a fault verification process routing, a normal process routing, or a termination process routing, based upon the fault detection analysis.

16 Claims, 8 Drawing Sheets

DETERMINATION OF A PROCESS FLOW BASED UPON FAULT DETECTION ANALYSIS

BACKGROUND OF THE INVENTION

1. Field of the Invention

This invention relates generally to semiconductor manufacturing, and, more particularly, to a method and apparatus for affecting wafer process flow based upon fault detection analysis.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed across a group of semiconductor wafers, sometimes referred to as a lot. For example, a process layer that may be composed of a variety of different materials may be formed across a semiconductor wafer. Thereafter, a patterned layer of photoresist may be formed across the process layer using known photolithography techniques. Typically, an etch process is then performed across the process layer using the patterned layer of photoresist as a mask. This etching process results in the formation of various features or objects in the process layer. Such features may be used as, for example, a gate electrode structure for transistors. Many times, trench isolation structures are also formed across the substrate of the semiconductor wafer to isolate electrical areas across a semiconductor wafer. One example of an isolation structure that can be used is a shallow trench isolation (STI) structure.

The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control application, which can be a software program that automatically retrieves the data needed to execute a manufacturing process.

FIG. 1 illustrates a typical semiconductor wafer 105. The semiconductor wafer 105 typically includes a plurality of individual semiconductor die 103 arranged in a grid 150. Using known photolithography processes and equipment, a patterned layer of photoresist may be formed across one or more process layers that are to be patterned. As part of the photolithography process, an exposure process is typically performed by a stepper on multiple die 103 locations at a time, depending on the specific photomask employed. The patterned photoresist layer can be used as a mask during etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features that are to be replicated in an underlying process layer.

Turning now to FIG. 2, a typical flow of processes performed on a semiconductor wafer 105 by a semiconductor manufacturing system is illustrated. A manufacturing system processes a group of semiconductor wafers 105 (block 210). The manufacturing system may then generally acquire metrology data relating to the processed semiconductor wafers 105 (block 220). The acquired metrology data is then analyzed for process errors and/or errors on the processed semiconductor wafers 105 (block 230). Additionally, the manufacturing system may perform fault detection relating to the processing of semiconductor wafers 105 (block 240). The fault detection data is then analyzed for any faults that may have occurred during processing of the semiconductor wafers 105 (block 250).

The analyzed metrology data may then be used to perform feedback corrections in order to improve the accuracy of the processes performed on subsequent semiconductor wafers 105 (block 260). Additionally, the manufacturing system may adjust the process operation based upon the fault detection data analysis (block 270). The manufacturing system may then perform subsequent processing of semiconductor wafers 105 (block 280).

Among the problems associated with the current methodology is a lack of efficient verification of the faults that are detected. In addition, the errors detected by analyzing the metrology data may contain inherent errors, such as calibration errors that may not be validated properly. However, the analysis relating to the fault detection and the metrology data is generally used to modify and control previously scheduled process flow operations. This may result in inefficient routing of semiconductor wafers 105 throughout a manufacturing facility associated with the manufacturing system. The current methodologies may result in processed semiconductor wafers 105 that may contain lower yields and quality results. Generally, the process flow may be adjusted in a manual fashion in response to the analysis of metrology data or fault detection data. This may lead to inefficient verification of process errors and faults.

The present invention is directed to overcoming, or at least reducing, the effects of, one or more of the problems set forth above.

SUMMARY OF THE INVENTION

In one aspect of the present invention, a method is provided for the determination of a process flow based upon fault detection. A process step upon a workpiece is performed. Fault detection analysis based upon the process step performed upon the workpiece is performed. A workpiece routing process is performed based upon the fault detection analysis. The wafer routing process includes using a controller to perform a non-standard process routing.

In another aspect of the present invention, a system is provided for the determination of a process flow based upon fault detection. The system includes a processing tool to process a workpiece. The system also includes a process controller operatively coupled to the processing tool. The controller is capable of performing a workpiece routing process based upon a fault detection analysis. The wafer routing process includes performing a rework process routing, a non-standard process routing, a fault verification process routing, a normal process routing, and/or a termination process routing, based upon the fault detection analysis.

In another aspect of the present invention, an apparatus is provided for the determination of a process flow based upon fault detection. The apparatus includes a process controller adapted to perform a workpiece routing process based upon a fault detection analysis. The workpiece routing process includes performing a rework process routing, a non-standard process routing, a fault verification process routing, a normal process routing, and/or a termination process routing, based upon the fault detection analysis.

In yet another aspect of the present invention, a computer readable program storage device encoded with instructions is provided for the determination of a process flow based upon fault detection. A computer readable program storage device encoded with instructions that, when executed by a computer, performs a method, which comprises: performing a process step upon a workpiece; performing fault detection analysis based upon the process step performed upon the workpiece; and performing a workpiece routing process based upon the fault detection analysis. The workpiece routing process includes using a controller to perform at least one of a rework process routing, a non-standard process routing, a fault verification process routing, a normal process routing, and a termination process routing, based upon the fault detection analysis.

BRIEF DESCRIPTION OF THE DRAWINGS

The invention may be understood by reference to the following description taken in conjunction with the accompanying drawings, in which like reference numerals identify like elements, and in which.

Figure 1:
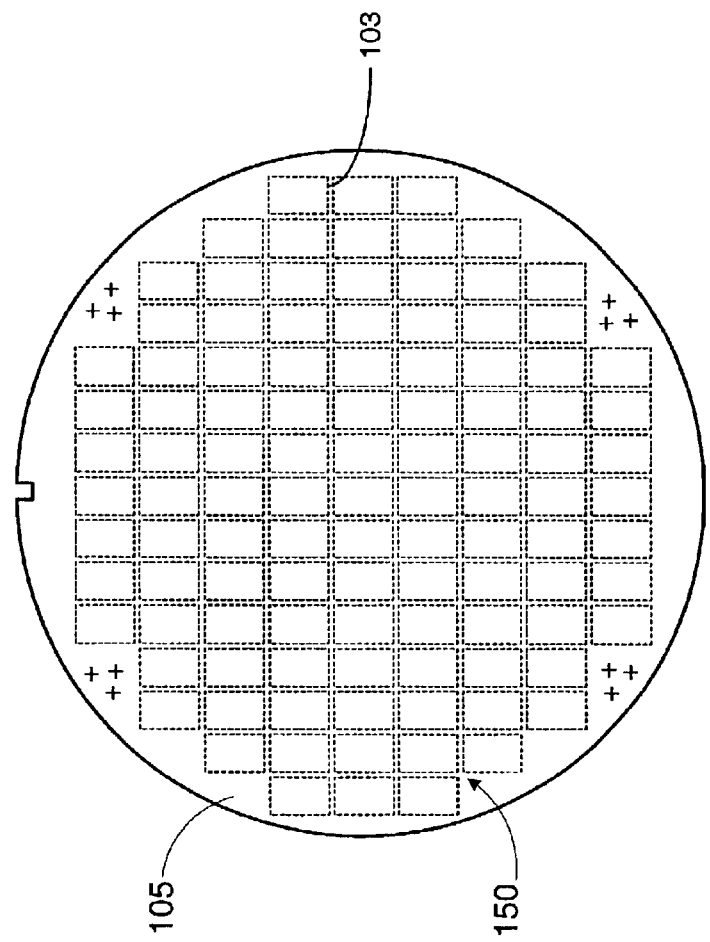
FIG. 1 is a simplified diagram of a prior art semiconductor wafer being processed.
Figure 2:
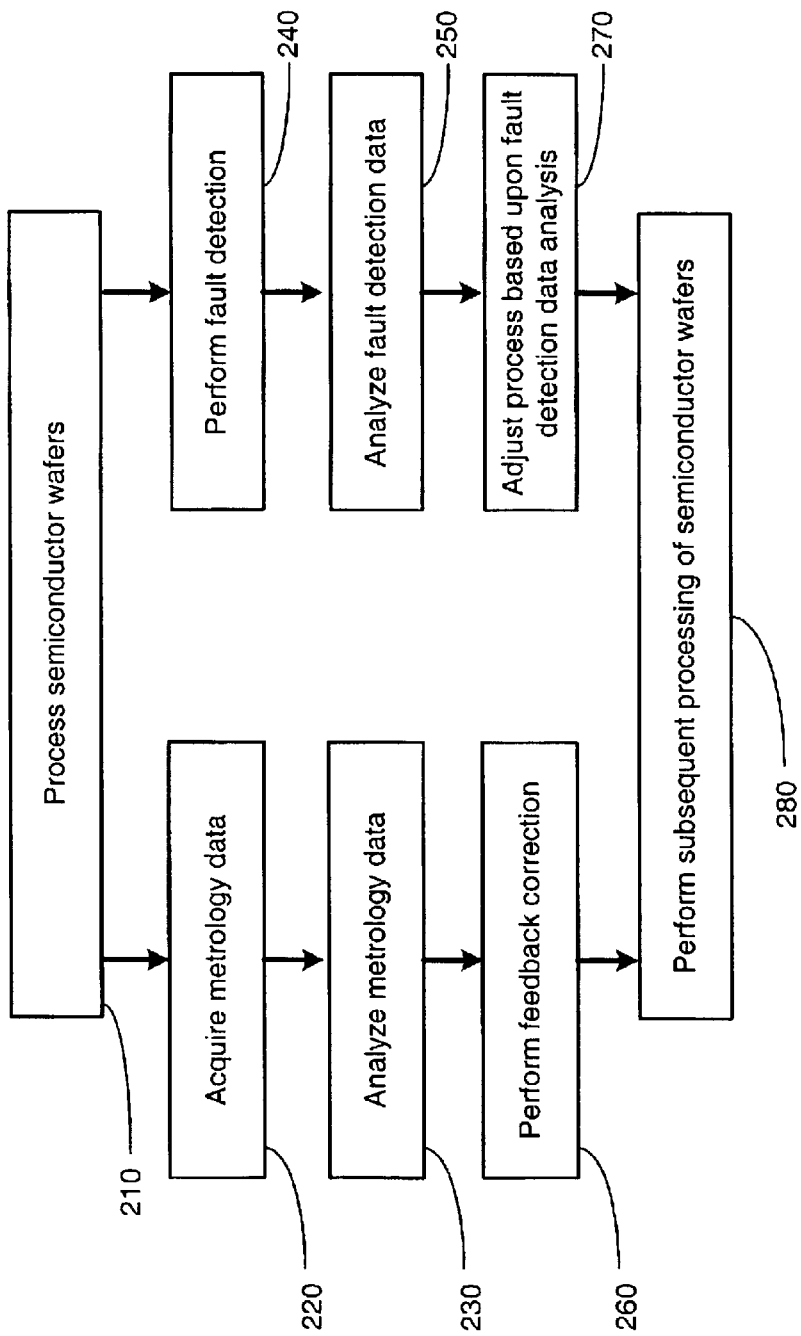
FIG. 2 illustrates a simplified flowchart depiction of a prior art process flow during manufacturing of semiconductor wafers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, workpieces (e.g., semiconductor wafers 105, semiconductor devices, etc.) are stepped through multiple manufacturing process tools. Embodiments of the present invention provide for performing an automatic workpiece (e.g., wafer) routing process based upon fault detection analysis. Fault detection and classification provided by embodiments of the present invention may provide information relating to processed semiconductor wafers 105 and how the semiconductor wafer 105 are being routed through one or more processing tools. Based upon fault detection analysis, embodiments of the present invention provide for an automatic process flow routing mechanism in response to validating faults or errors detected during processing of semiconductor wafers 105. Embodiments of the present invention provide for automating actual verification of faults or errors detected during processing of semiconductor wafers 105.

Figure 3:
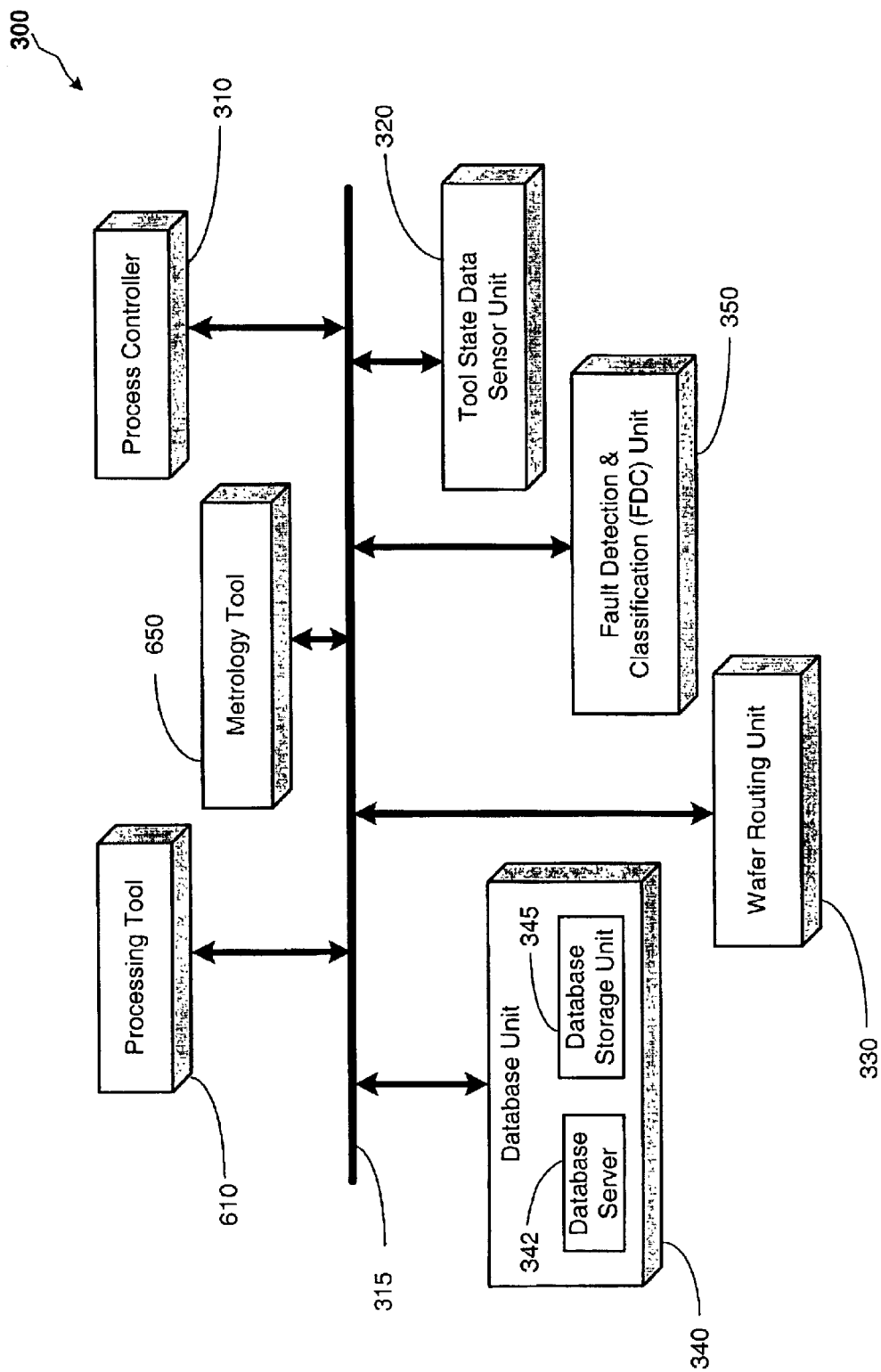
FIG. 3 provides a block diagram representation of a system in accordance with one illustrative embodiment of the present invention.

Turning now to FIG. 3, a block diagram depiction of a system 300 in accordance with embodiments of the present invention is illustrated. A process controller 310 in the system 300 is capable of controlling various operations relating to a processing tool 610. The system 300 is capable of acquiring manufacturing related data, such as metrology data, related to processed semiconductor wafers 105, tool state data, and the like. The system 300 may also comprise a metrology tool 650 to acquire metrology data related to the processed semiconductor wafers 105.

The system 300 may also comprise a database unit 340. The database unit 340 is provided for storing a plurality of types of data, such as manufacturing-related data, or data related to the operation of the system 300 (e.g., the status of the processing tool 610, the status of semiconductor wafers 105, etc.). The database unit 340 may store tool state data relating to a plurality of process runs performed by the processing tool 610. The database unit 340 may comprise a database server 342 for storing tool state data and/or other manufacturing data related to processing semiconductor wafers 105, into a database storage unit 345.

The system 300 may also comprise a tool state data sensor unit 320 for acquiring tool state data. The tool state data may include pressure data, temperature data, humidity data, gas flow data, various electrical data, and the like, related to operations of the processing tool 610. Exemplary tool state data for an etch tool may include gas flow, chamber pressure, chamber temperature, voltage, reflected power, backside helium pressure, RF tuning parameters, etc. The tool state data may also include data external to the processing tool 610, such as ambient temperature, humidity, pressure, etc. A more detailed illustration and description of the tool state data sensor unit 320 is provided in FIG. 4 and accompanying description below.

The system 300 may also comprise a fault detection and classification (FDC) unit 350. The fault detection and classification unit 350 is capable of providing data relating to faults during processing of semiconductor wafer 105. Fault detection analysis performed by the fault detection and classification unit 350 may include analysis of tool state data and/or metrology data. The FDC unit 350 may correlate particular tool state data to errors detected on the processed semiconductor wafer 105 by analyzing the metrology tool data. For example, particular errors, such as critical dimension errors discovered on the processed semiconductor wafers 105 may be correlated to particular gas flow rates or temperature data relating to tool state data. The fault detection performed by the FDC unit 350 may also include analyzing data from in situ sensors integrated into the processing tools 610. Based upon the fault detection analysis provided by the FDC unit 350, the system 300 may perform a modification to a previously or predetermined routing scheme determined by the system 300.

A wafer routing unit 330 in the system 300 is capable of analyzing the fault detection data and/or the metrology data and is capable of determining an appropriate routing for one or more semiconductor wafers 105. For example, the wafer routing unit 330 may divert a semiconductor wafer 105, or a group of semiconductor wafers 105, to a rework procedure, to a non-standard process, to a fault verification process to verify any faults detected, and/or to a normal process flow operation mode. A more detailed description of the wafer routing unit 330 is provided in FIG. 5 and accompanying description below.

The process controller 310, the wafer routing unit 330, and/or the FDC unit 350, may be software, hardware, or firmware units that are standalone units or may be integrated into a computer system associated with the system 300. Furthermore, the various components represented by the blocks illustrated in FIG. 3 may communicate with one another via a system communications line 315. The system communications line 315 may be a computer bus link, a dedicated hardware communications link, a telephone system communications link, a wireless communications link, or other communication links that may be implemented by those skilled in the art having benefit of the present disclosure.

Figure 4:
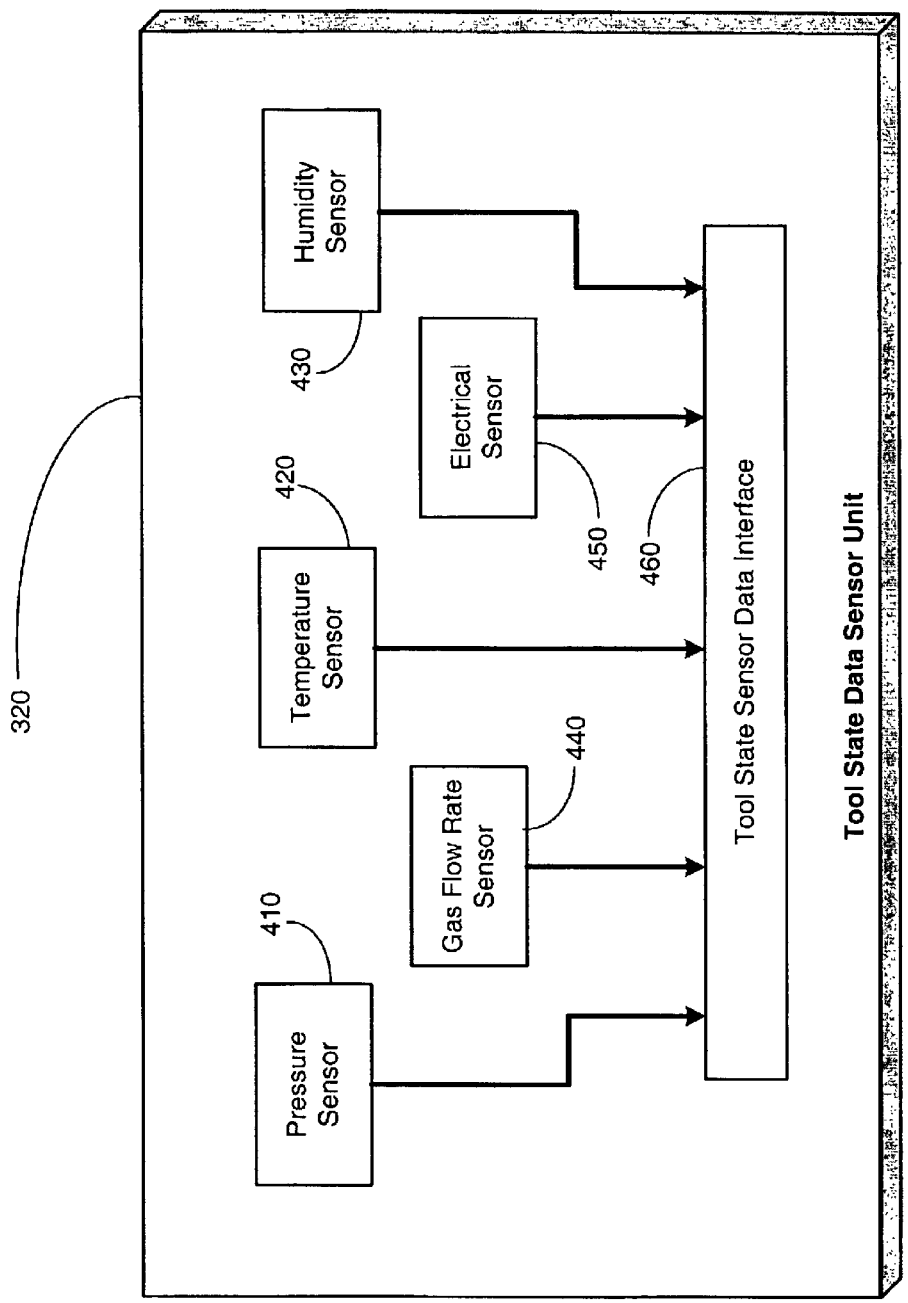
FIG. 4 illustrates a more detailed block diagram representation of a tool state data sensor unit of FIG. 3, in accordance with one illustrative embodiment of the present invention.

Turning now to FIG. 4, a more detailed block diagram depiction of the tool state data sensor unit 320 illustrated in FIG. 3 is provided. The tool state data sensor unit 320 may comprise any of a variety of different types of sensors, e.g., a pressure sensor 410, a temperature sensor 420, a humidity sensor 430, a gas flow rate sensor 440, and an electrical sensor 450, etc. In an alternative embodiment, the tool state data sensor unit 320 may comprise in situ sensors that are integrated into the processing tool 610. The pressure sensor 410 is capable of detecting the pressure within the processing tool 610. The temperature sensor 420 is capable of sensing the temperature of various portions of the processing tool 610. The humidity sensor 430 is capable of detecting the relative humidity at various portions in the processing tool 610, or of the surrounding ambient conditions. The gas flow rate sensor 440 may comprise a plurality of flow-rate sensors that are capable of detecting the flow-rate of a plurality of process gases utilized during processing of semiconductor wafers 105. For example, the gas flow rate sensor 440 may comprise sensors that can detect the flow rate of gases such as $NH_3$, $SiH_4$, $N_2$, $N_2O$, and/or other process gases.

In one embodiment, the electrical sensor 450 is capable of detecting a plurality of electrical parameters, such as the current provided to a lamp used in a photolithography process. The tool state data sensor unit 320 may also comprise other sensors capable of detecting a variety of manufacturing variables known to those skilled in the art having benefit of the present disclosure. The tool state data sensor unit 320 may also comprise a tool state sensor data interface 460. The tool state sensor data interface 460 may receive sensor data from the various sensors that are contained within, or associated with, the processing tool 610 and/or the tool state data sensor unit 320 and transmit the data to the process controller 310.

Figure 5:
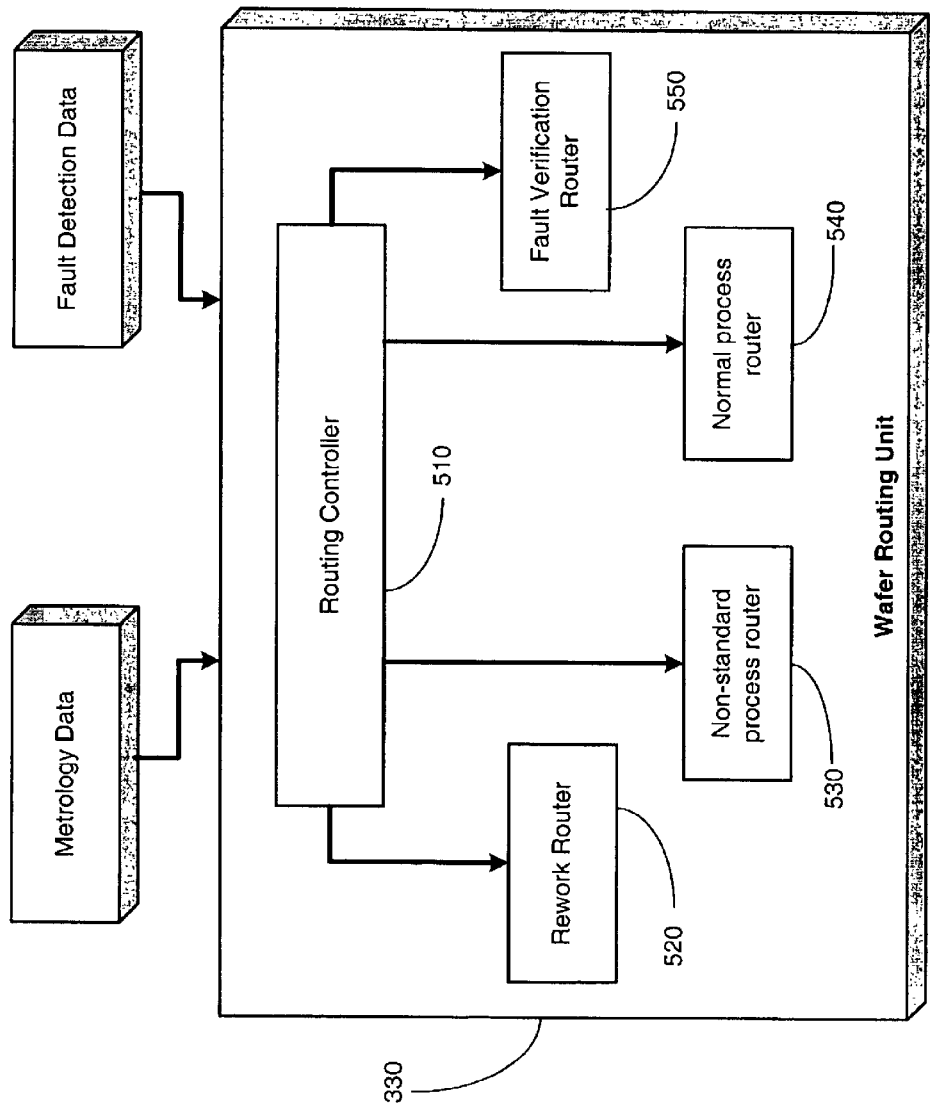
FIG. 5 illustrates a more detailed block diagram representation of the wafer routing unit of FIG. 3, in accordance with one illustrative embodiment of the present invention.

Turning now to FIG. 5, a more detailed block diagram depiction of the wafer routing unit 330 is illustrated. The wafer routing unit 330 may receive metrology data and/or fault detection data from the FDC unit 350. A routing controller 510 in the wafer routing unit 330 is capable of implementing one or more algorithms that is capable of analyzing the fault detection data and/or the metrology data and is capable of determining whether a process flow related to semiconductor wafers 105 is to be modified. Based upon the type of faults detected, different routing paths may be determined by the routing controller 510.

The routing controller 510 may provide data to a rework router 520, to a nonstandard process router 530, to a normal process router 540, and/or to a fault verification router 550. The rework router 520 may route one or a batch of semiconductor wafers 105 for additional rework based upon the faults and/or the metrology errors detected on the processed semiconductor wafers 105. For example, if the critical dimension of features formed on the semiconductor wafers 105 is substantially off target, a rework procedure may be needed to correct the critical dimension errors. Therefore, the rework router 520 may route selected semiconductor wafers 105 to a rework processing tool.

The nonstandard process router 530 may route particular semiconductor wafers 105 to nonstandard processes that are part of an inline process flow for certain types of processing. For example, if the routing controller 510 determines that the film deposited on the semiconductor wafers 105 is slightly thicker than acceptable tolerances, a nonstandard etch process may be implemented to correct such errors. Generally, the nonstandard etch process may be performed without rerouting the semiconductor wafers 105 to a rework section of a manufacturing facility associated with the system 300. Therefore, the semiconductor wafers 105 are kept in an inline process flow format with slight nonstandard process modifications.

Alternatively, the routing controller 510 may determine that based upon the faults detected, the normal predetermined routing process flow should be followed, which may be implemented by the normal process router 540. Additionally, the routing controller 510 may determine that additional verification of the faults and/or errors detected on the processed semiconductor wafers 105 may be required. Therefore, the fault verification router 550 may route selected semiconductor wafers 105 for additional fault/error analysis. For example, additional metrology data acquisition may be performed on selected semiconductor wafers 105.

For example, additional sites on the semiconductor wafers 105 may be analyzed to further define wafer-quality. Based upon the fault detected, the routing controller 510 in the wafer routing unit 330 may route semiconductor wafers 105 based upon one of the plurality of process routing schemes within a manufacturing facility associated with the system 300.

Figure 6:
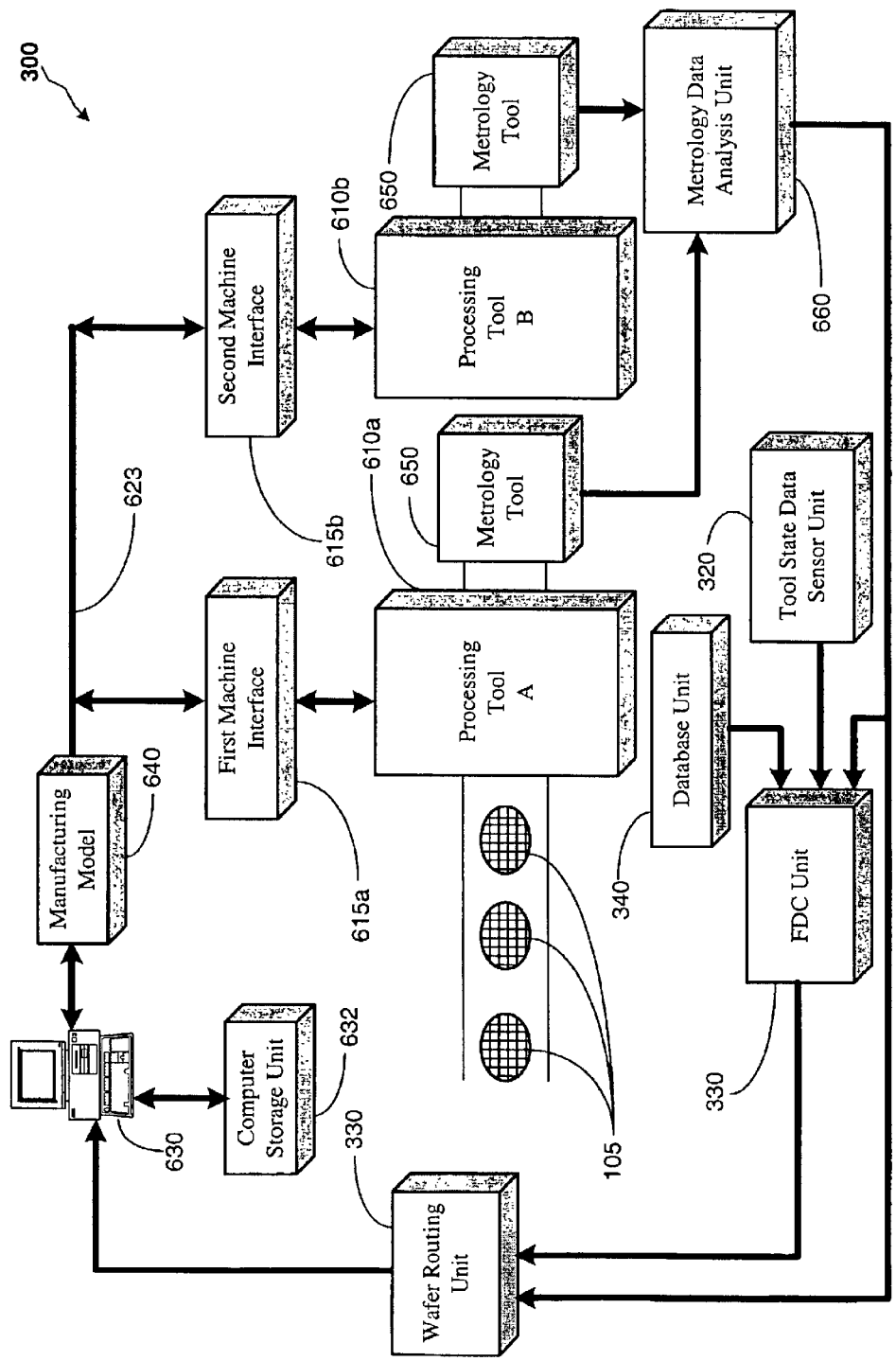
FIG. 6 illustrates a more detailed block diagram representation of the system shown in FIG. 3, in accordance with one illustrative embodiment of the present invention.

Turning now to FIG. 6, a more detailed block diagram of the system 300 in accordance with one embodiment of the present invention is illustrated. Semiconductor wafers 105 are processed on processing tools 610a, 610b using a plurality of control input signals, or manufacturing parameters, provided via a line or network 623. The control input signals, or manufacturing parameters, on the line 623 are sent to the processing tools 610a, 610b from a computer system 630 via machine interfaces 615a, 615b. The first and second machine interfaces 615a, 615b are generally located outside the processing tools 610a, 610b. In an alternative embodiment, the first and second machine interfaces 615a, 615b are located within the processing tools 610a, 610b. The semiconductor wafers 105 are provided to and carried from a plurality of processing tools 610. In one embodiment, semiconductor wafers 105 may be provided to a processing tool 610 manually. In an alternative embodiment, semiconductor wafers 105 may be provided to a processing tool 610 in an automatic fashion (e.g., robotic movement of semiconductor wafers 105). In one embodiment, a plurality of semiconductor wafers 105 is transported in lots (e.g., stacked in cassettes) to the processing tools 610.

In one embodiment, the computer system 630 sends control input signals, or manufacturing parameters, on the line 623 to the first and second machine interfaces 615a, 615b. The computer system 630 is capable of controlling processing operations. In one embodiment, the computer system 630 is a process controller. The computer system 630 is coupled to a computer storage unit 632 that may contain a plurality of software programs and data sets. The computer system 630 may contain one or more processors (not shown) that are capable of performing the operations described herein. The computer system 630 employs a manufacturing model 640 to generate control input signals on the line 623. In one embodiment, the manufacturing model 640 contains a manufacturing recipe that determines a plurality of control input parameters that are sent on the line 623 to the processing tools 610a, 610b.

In one embodiment, the manufacturing model 640 defines a process script and input control that implement a particular manufacturing process. The control input signals (or control input parameters) on the line 623 that are intended for processing tool A 610a are received and processed by the first machine interface 615a. The control input signals on the line 623 that are intended for processing tool B 610b are received and processed by the second machine interface 615b. Examples of the processing tools 610a, 610b used in semiconductor manufacturing processes are steppers, etch process tools, deposition tools, and the like.

One or more of the semiconductor wafers 105 that are processed by the processing tools 610a, 610b can also be sent to a metrology tool 650 for acquisition of metrology data. The metrology tool 650 may be a scatterometry data acquisition tool, an overlay-error measurement tool, a critical dimension measurement tool, and the like. In one embodiment, a metrology tool 650 examines one or more processed semiconductor wafers 105. The metrology data analysis unit 660 may collect, organize, and analyze data from the metrology tool 650. The metrology data is directed to a variety of physical or electrical characteristics of the devices formed across the semiconductor wafers 105. For example, metrology data may be obtained as to line width measurements, depth of trenches, sidewall angles, thickness, resistance, and the like. Metrology data may be used to determine faults that may be present across the processed semiconductor wafers 105, which may be used to quantify the performance of the processing tools 610.

As described above, data from the metrology data analysis unit 660 is sent to the wafer routing unit 330 for analysis. In addition, fault detection data from the FDC unit 350 is also sent to the wafer routing unit 330. The FDC unit 350 may receive tool state data from the tool state data sensor unit 320. The FDC unit 350 may also receive stored metrology data and/or tool state data relating to previous processes from the database unit 340. The wafer routing unit 330 provides process routing data to the computer system 630 for implementation of semiconductor wafers 105 routing throughout the manufacturing facility associated with the system 300.

Figure 7:
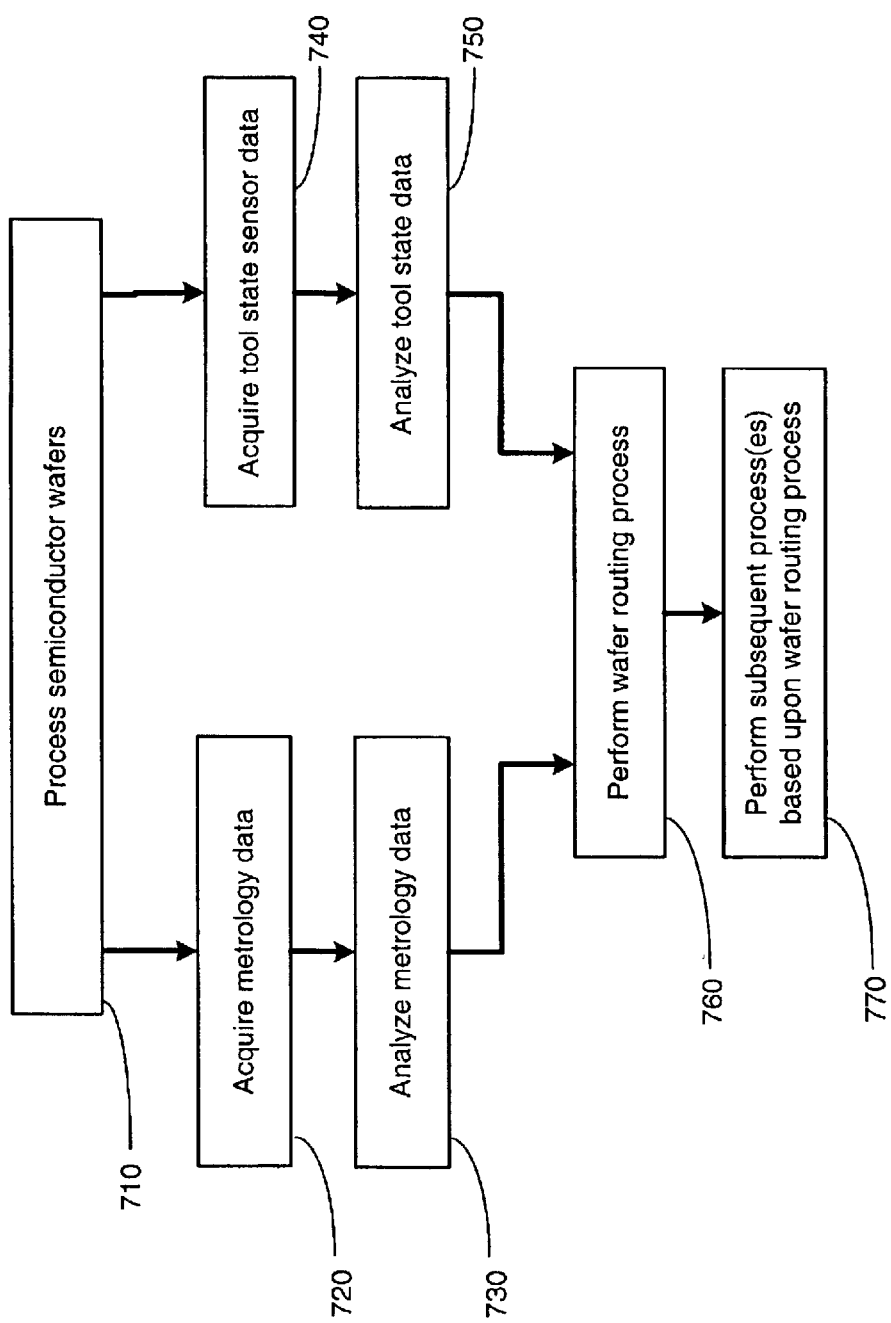
FIG. 7 illustrates a flowchart depiction of a method in accordance with one illustrative embodiment of the present invention.

Turning now to FIG. 7, a flow chart depiction of the methods in accordance with embodiments of the present invention is illustrated. The system 300 processes semiconductor wafers 105 (block 710). The system 300 may then acquire metrology data related to the processed semiconductor wafers 105 (block 720). The system 300 may use one or more metrology tools 650 to acquire metrology data relating to the processed semiconductor wafers 105. The system 300 may also analyze the metrology data for errors relating to the processed semiconductor wafers 105 (block 730). In addition, the system 300 may acquire tool state sensor data (block 740). The tool state sensor data may include pressure data, temperature data, humidity data, and/or gas flow rate data, etc. The tool state sensor data may be acquired by the tool state sensor unit 320. The system 300 may analyze the tool state sensor data and correlate those with particular errors as determined by the analysis of the metrology data (block 750).

Upon analysis of the tool state data and/or the metrology data, which may comprise performing a fault detection analysis, the system 300 may perform a semiconductor wafer 105 routing process (block 760). The semiconductor wafer 105 process provides routing data for directing semiconductor wafers 105 throughout the plurality of areas associated with a manufacturing facility in the system 300. For example, the wafer routing process may route semiconductor wafers 105 to a rework process, to a nonstandard process, to a normal process, and/or to a fault verification process. A more detailed description of the semiconductor wafer 105 routing process is provided in FIG. 8 and accompanying description below. Upon performing the semiconductor wafer 105 routing process, the system 300 may continue to perform subsequent processes as implemented by various components of the system 300 based upon the routing process (block 770).

Figure 8:
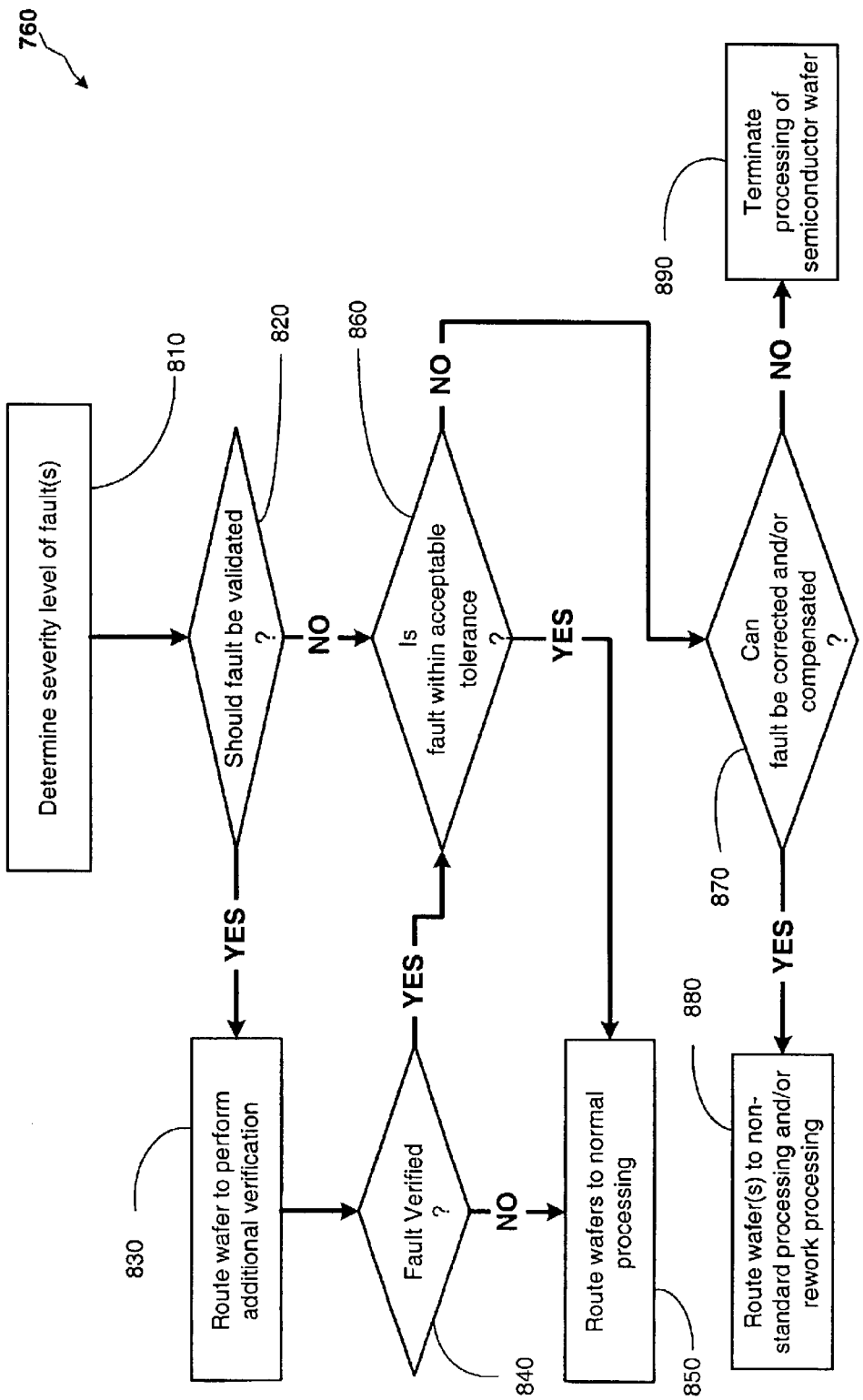
FIG. 8 illustrates a more detailed flowchart depiction of a method of performing a wafer routing process, as indicated in FIG. 7, in accordance with one illustrative embodiment of the present invention.

Turning now to FIG. 8, a more detailed flow chart depiction of the step of performing the semiconductor wafer 105 routing process as indicated in block 760 of FIG. 7 is illustrated. Based upon the fault detection analysis, the system 300 may determine a severity level of the analyzed fault associated with the processed semiconductor wafers 105 (block 810). Based upon the severity level of the fault, the system 300 may determine whether the fault should be validated (block 820). If the system 300 determines that the fault is to be validated, the system 300 may route the semiconductor wafer 105 to perform additional verification, such as additional metrology measurements, fault analysis, and/or the like (block 830). The system 300 may then determine whether the faults have been adequately verified (block 840).

If the system 300 determines that the fault is not verified (i.e., the fault really did not exist or is not adequately severe), the system 300 may then route the semiconductor wafer 105 or batch of semiconductor wafers 105 to continue normal processing (block 850). If the system 300 verifies that the fault indeed does exist (as indicated in block 840), the system 300 makes a determination whether the fault is within an acceptable tolerance (block 860). Referring back to block 820, if the system 300 determines that the fault is not to be validated (e.g., the system 300 can qualify the status of the fault with a predetermined level of confidence), the system 300 then determines whether the fault is within an acceptable tolerance (block 860). When the system 300 determines that the fault is within an acceptable tolerance the semiconductor wafers 105 may be routed for continued normal processing block 850).

When the system 300 determines that the detected fault is not within acceptable tolerance levels, a determination is made whether the fault can be corrected or compensated (block 870). When the system 300 determines that the detected fault could be corrected and/or compensated, the system 300 routes the semiconductor wafers 105 to perform nonstandard processing or rework processing (block 880). The system 300 may then perform rework procedures or nonstandard processing using feed-forward corrections to compensate for the fault detected. For example, excess deposited film may be removed by a nonstandard etch process. As another example, in a rework process, a resist mask may be completely stripped off and the material may be reprocessed and placed back into the normal process flow. When the system 300 determines that the fault may not be corrected or compensated, processing of those particular semiconductor wafers 105 may be terminated (block 890). Completion of the steps described in FIG. 8 substantially completes the step of performing the semiconductor wafer 105 routing process as indicated in block 760 of FIG. 7.

Utilizing embodiments of the present invention, an automated routing of semiconductor wafers 105 may be made in response to fault detection analysis. Therefore, selected semiconductor wafers 105 may be routed, based upon one of a number of routing schemes, within a manufacturing facility associated with the system 300. Thus, more efficient rework or error-correction procedures upon the semiconductor wafers 105 may be performed. This may result in higher yields and more accurately processed semiconductor wafers 105. The concepts disclosed herein may be applied to a variety of manufacturing environments, including semiconductor wafer processing environment, and/or other workpiece processing environments.

The principles taught by the present invention can be implemented in an Advanced Process Control (APC) Framework, such as a Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI. The APC framework is a preferred platform from which to implement the control strategy taught by the present invention. In some embodiments, the APC framework can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC framework allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
 performing a process step upon a workpiece;
 performing fault detection analysis based upon said process step performed upon said workpiece, performing said fault detection analysis comprises:
  determining a severity level of a detected fault;
  determining whether said detected fault is within a predetermined range of tolerance;
  determining whether said fault can be corrected; and
 performing a workpiece routing process in response to said fault detection analysis, said workpiece routing process comprising using a controller to perform a non-standard process routing based upon said fault detection analysis.

2. The method of claim 1, wherein performing said process step upon said workpieces further comprises performing said process step upon a semiconductor wafer.

3. The method of claim 1, wherein performing a workpiece routing process further comprises using a controller to perform a rework process routing, a fault verification process routing, a normal process routing, and a termination process routing, based upon said fault detection analysis.

4. The method of claim 1, wherein performing fault detection analysis upon said process step performed upon said workpiece further comprises acquiring at least one of a metrology data and tool state data.

5. The method of claim 4, wherein acquiring said tool state data further comprises acquiring at least one of a pressure data, a temperature data, a humidity data, and a gas flow rate data relating to said process step performed upon said workpiece.

6. The method of claim 5, wherein acquiring said metrology data further comprises acquiring data related to a critical dimension relating to a feature formed upon said workpiece.

7. The method of claim 5, wherein acquiring said metrology data further comprises acquiring data related to a film thickness of a layer formed upon sad workpiece.

8. The method of claim 5, wherein acquiring said metrology data relating to said processed workpiece further comprises acquiring metrology data using a metrology tool.

9. The method of claim 8, wherein performing said fault detection analysis further comprises correlating said metrology data with said tool state data.

10. The method of claim 8, wherein performing said fault detection analysis further comprises:
    determining whether to validate said fault.

11. The method of claim 10, wherein performing said fault verification process routing further comprises validating said detected fault in response to a determination to verify said fault, said verifying comprising routing said workpiece to perform additional acquisition of at least one of metrology data and tool state data and verifying if said detected fault exists.

12. The method of claim 10, wherein performing said normal process routing further comprises routing said workpiece to a normal process based upon a determination that said detected fault does not exist.

13. The method of claim 10, wherein performing said rework process routing further comprises routing said workpiece to a rework processing tool in response to a determination that said fault can be corrected.

14. The method of claim 10, wherein performing said non-standard process routing further comprises routing said workpiece to a non-standard processing tool in response to a determination that said fault can be corrected.

15. The method of claim 10, wherein performing said termination process routing further comprises terminating processing of said workpiece in response to a determination that said fault cannot be corrected.

16. A method, comprising:
    performing a process step upon a workpiece;
    acquiring metrology data relating to said workpiece;
    acquiring tool state data relating to said process performed upon said workpiece;
    performing fault detection analysis based upon said metrology data and said tool state data, performing said fault detection analysis comprises:
        determining a severity level of a detected fault;
        determining whether said detected fault is within a predetermined range of tolerance;
        determining whether said fault can be corrected; and;
    performing an automatic workpiece routing process based upon said fault detection analysis, said automatic workpiece routing process comprising using a controller to perform at least one of a rework process routing, a non-standard process routing, a fault verification process routing, a normal process routing, and a termination process routing, based upon said fault detection analysis.

* * * * *

UNITED STATES PATENT AND TRADEMARK OFFICE
CERTIFICATE OF CORRECTION

PATENT NO. : 6,740,534 B1
DATED : May 25, 2004
INVENTOR(S) : Ernest D. Adams, III et al.

It is certified that error appears in the above-identified patent and that said Letters Patent is hereby corrected as shown below:

Column 4,
Line 12, replace "arc" with -- are --.

Column 9,
Line 16, replace "block 850)" with -- (block 850) --.

Column 11,
Line 3, replace "sad" with -- said --.

Signed and Sealed this

Sixth Day of September, 2005

JON W. DUDAS
*Director of the United States Patent and Trademark Office*